(12) United States Patent
Maravic et al.

(10) Patent No.: US 8,077,757 B2
(45) Date of Patent: Dec. 13, 2011

(54) SAMPLING METHOD FOR A SPREAD SPECTRUM COMMUNICATION SYSTEM

(75) Inventors: Irena Maravic, London (GB); Martin Vetterli, Grandvaux (CH); Julius Kusuma, Houston, TX (US)

(73) Assignee: QUALCOMM Incorporated, San Diego, CA (US)

( * ) Notice: Subject to any disclaimer, the term of this patent is extended or adjusted under 35 U.S.C. 154(b) by 411 days.

(21) Appl. No.: 10/680,839

(22) Filed: Oct. 7, 2003

(65) Prior Publication Data
US 2007/0183535 A1 Aug. 9, 2007

(51) Int. Cl.
*H04B 1/00* (2006.01)
(52) U.S. Cl. .......... 375/148; 375/147; 375/355; 327/44; 327/45
(58) Field of Classification Search ........... 455/193.1, 455/310, 320, 324, 319, 491, 130, 150.1; 375/310, 320, 324, 319, 491, 240, 240.01, 375/240.21, 354–355, E7.188, 130, 140, 375/136, 141–148, 152; 370/130, 136, 140, 370/141–148, 152, 310, 320, 324, 319, 491; 327/1, 39, 44, 45
See application file for complete search history.

(56) References Cited

U.S. PATENT DOCUMENTS

| | | | |
|---|---|---|---|
| 4,716,453 A * | 12/1987 | Pawelski | 375/240.01 |
| 4,771,438 A * | 9/1988 | Nash | 375/235 |
| 5,302,950 A | 4/1994 | Johnson et al. | |
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,852,630 A * | 12/1998 | Langberg et al. | 375/219 |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |

(Continued)

FOREIGN PATENT DOCUMENTS

WO 9963775 12/1999

OTHER PUBLICATIONS

Unser, Michael, "Sampling—50 Years After Shannon", Proceedings of the IEEE, vol. 88, No. 4: pp. 569-587, Apr. 2000.*

(Continued)

*Primary Examiner* — David C. Payne
*Assistant Examiner* — James M Perez
(74) *Attorney, Agent, or Firm* — John Rickenbrode

(57) ABSTRACT

Method for decoding a signal sent over a bandwidth-expanding communication system, where both channel estimation and signal detection are carried out on a set of samples generated by sampling the received signal at a sub-Nyquist rate, thus allowing for a significant reduction of the complexity of the sampling device of receivers using said method, as well as a significant reduction of their computational requirements.

66 Claims, 5 Drawing Sheets

U.S. PATENT DOCUMENTS

| | | | |
|---|---|---|---|
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,370,129 B1* | 4/2002 | Huang | 370/329 |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,507,603 B1* | 1/2003 | Haga et al. | 375/147 |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Richards et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,900,732 B2 | 5/2005 | Richards | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,980,613 B2 | 12/2005 | Krivokapic | |
| 6,989,751 B2 | 1/2006 | Richards | |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,806 B2 | 4/2006 | Fullerton | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,076,168 B1* | 7/2006 | Shattil | 398/76 |
| 7,079,827 B2 | 7/2006 | Richards et al. | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,218,666 B2* | 5/2007 | Baum et al. | 375/148 |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 2002/0051433 A1* | 5/2002 | Affes et al. | 370/335 |
| 2004/0057593 A1* | 3/2004 | Pedersen et al. | 381/321 |

OTHER PUBLICATIONS

Kozek W. et al., "Quadratic time-varying spectral estimation for underspread processes" Time-Frequency and Time Scale Analysis, 1944., Proceedings of the IEEE-SP Int'l Symposium on PA. New York, NY, pp. 460-463 XP010147437 (Oct. 25, 1994).

International Search Report, PCT/EP02/003390 International Search Authority European Patent Office—Aug. 19, 2002.

* cited by examiner

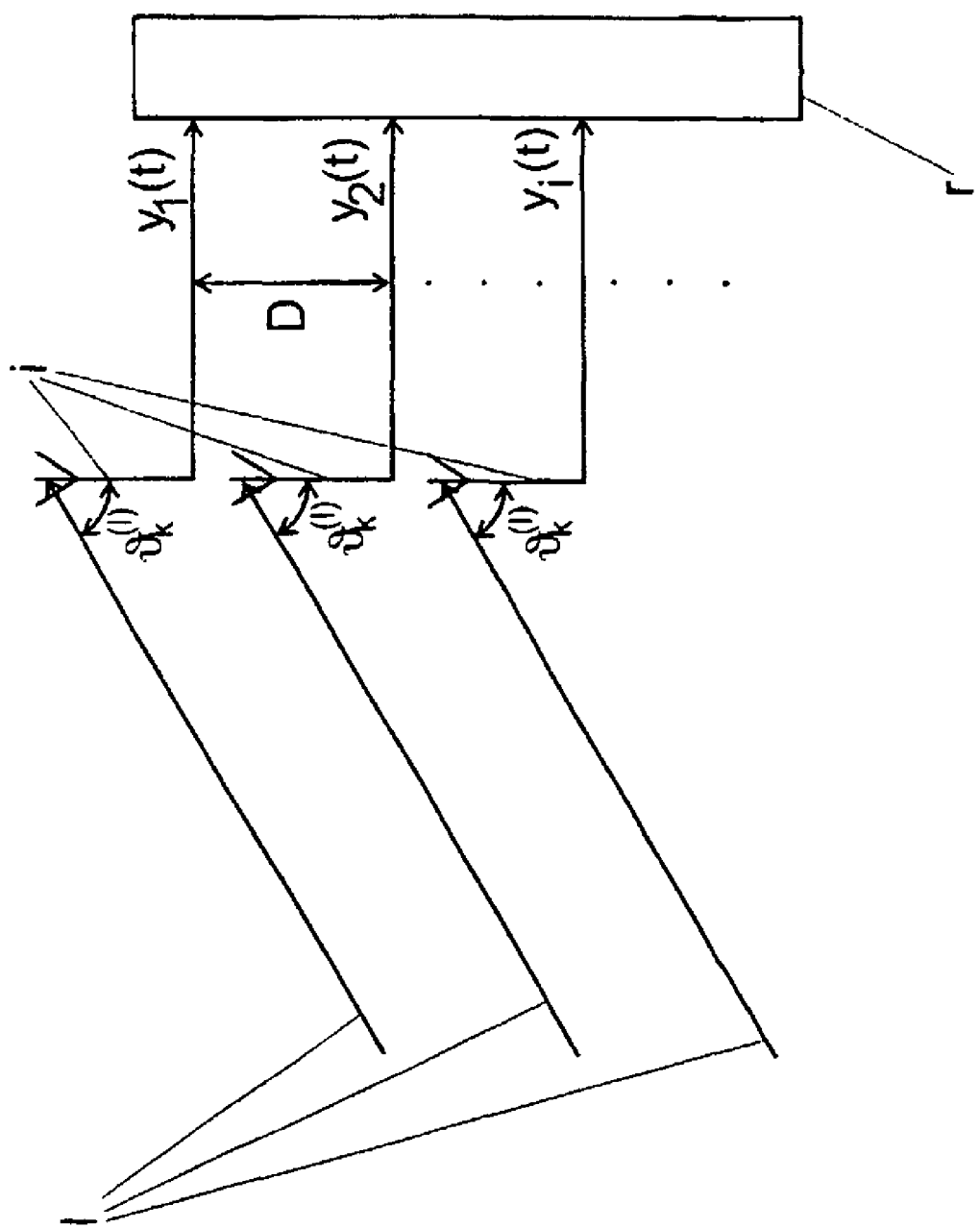

SAMPLING METHOD FOR A SPREAD SPECTRUM COMMUNICATION SYSTEM

The present invention relates to a method for decoding signals sent over a bandwidth-expanding communication system, said method allowing to perform both channel estimation and signal detection. The present invention also relates to a receiver using said method as well as to a communication system including said receiver.

A communication system is defined to be bandwidth-expanding if the transmitted signal occupies a bandwidth much larger than the minimum bandwidth required for sending the information contained in said transmitted signal. Bandwidth-expanding communication systems, such as Code Division Multiple Access (CDMA) communication systems or Ultra-Wide Band (UWB) communication systems for example, possess many intrinsic advantages over conventional communication systems, among which are selective addressing capability, high-resolution ranging, low-density power spectra for signal hiding, interference rejection, etc.

In a CDMA communication system, for example, bandwidth expansion is accomplished by means of a spreading code, often called a coding sequence, which is independent of the information data to be sent. Each symbol (information bit) of a signal sent over a CDMA communication system is coded with a coding sequence. The number of chips $N_c$ in the coding sequence is referred to as the spreading factor or the processing gain of the communication system. The chip rate of the transmitted signal is thus $N_c$ times higher than its symbol rate. Coding an information signal by the coding sequence therefore expands the signal's bandwidth by the value of the spreading factor $N_c$.

The spreading factor of a bandwidth-expanding communication system is typically a large number so as to provide said system with the above mentioned advantages over conventional communication systems.

In a CDMA communication system for example, the spreading factor $N_c$, or processing gain, determines the maximum number of users of the system. Namely, each user of the communication system is assigned a unique coding sequence which must have a low cross correlation with the other users' coding sequences, in order to minimize interference between users. In the ideal case, the user's codes are chosen from a set of orthogonal sequences. Therefore, the more users in the communication system, the longer these sequences must be, thus increasing the spreading factor $N_c$.

As shown in FIG. 1, the signals $x_k(t)$ sent by the users k over the bandwidth-expanding communication system are first encoded with a user specific coding sequence $s_k(t)$ by encoders 50 and then transmitted over a transmission channel c comprising emitters 60 and at least one receiver 61. The emitters 60 and the at least one receiver 61 can be for instance radio emitters and receivers working with amplitude or frequency modulation of a carrier signal. The received wideband signal y(t), which is a superposition of all signals 10 transmitted by the active users k over the transmission channel c must be decoded at the receiver's side in order to retrieve the signal $x_k(t)$ sent by each user k of the system. For example, a conventional analog CDMA receiver 70 comprises a bank of analog matched filters $f_k$, each matched to a specific user's coding sequence $s_k(t)$. The received wideband signal y(t) is filtered in parallel by each filter $f_k$. The information bits of the signal $x_k(t)$ sent by each user k can then be retrieved from the output signal of the corresponding filter $f_k$. This works well if there are few users with almost orthogonal coding sequences and if all transmitted signals have equal power levels. However, in the case when these power levels are not equal, the standard detector becomes almost useless. This is known as the near-far problem, and is currently usually alleviated by using for example complex power-control schemes, multiuser detection schemes, RAKE receivers, adaptive antenna arrays or 2-D RAKE receivers.

Current trend in design of communication systems is to implement as many parts of receivers as possible in digital hardware. The main reason is the fact that digital circuits are cheaper, faster and smaller. These receivers however imply that the received continuous-time signal must be first converted into a discrete-time signal by sampling. Defining the bandwidth of the received signal to be between the first two zeros in the signal's frequency spectrum, then according to the Shannon's sampling theorem, the sampling frequency must be at least twice the maximum frequency of the signal. The required minimal sampling frequency defined by this theorem, commonly referred to as the Nyquist frequency, increases with the bandwidth of the signal to be sampled.

For example, in a CDMA communication system, this means that the sampling frequency must be greater or equal to twice the chip rate of the received signal. In practice, however, in order to perform good signal detection even in noisy or fading multipath environments, the sampling frequency used by most current receivers is at least four times higher than the chip rate, thus requiring said receivers to include very fast and therefore complex and expensive analog sampling devices. Faster sampling devices have furthermore high power consumption and can hardly be integrated in mobile battery powered receivers.

In the case of a CDMA communication system, as already mentioned, the near-far problem can be alleviated by using for example multiuser detection schemes, RAKE receivers, adaptive antenna arrays or 2-D RAKE receivers, thus improving the system's performances. These methods can be implemented in digital receivers as well. However, they include sophisticated signal processing techniques that require exact knowledge of one or several parameters of the transmission channel, such as relative delays of different users' signals with respect to a reference in the receiver, amplitude attenuations of these signals along the different propagation paths, their direction-of-arrival at the receiver, etc.

Estimation of these parameters, referred to as channel estimation, is crucial in all bandwidth-expanding, or spread-spectrum communication systems, but at the same time is the hardest part of system design. In radio communication systems, for example, channel estimation, which can be performed during a dedicated training phase, represents the major problem, particularly in the case when a mobile system is subject to multipath fading, that is, when the transmitted signal follows different propagation paths from the emitters to the receiver, each path having different attenuation characteristics, delays and directions-of-arrival. The existing solutions typically require sampling the received signal at a high sampling frequency at the receiver's side, the sampling frequency being usually a multiple of the signal's chip rate, thus generating an excessive set of samples during the training phase. The propagation parameters are then estimated from this set of samples, by solving an optimization problem that involves large dimension matrices and complicated temporal and/or spatial operations, thus making this approach computationally intensive and sometimes unaffordable in real-time equipment. Once the propagation parameters have been estimated for the signals transmitted by all users over the transmission channel, the digital receiver can proceed with signal detection, that is, retrieving the information sent by each user.

An aim of the present invention is to provide a method for decoding a signal sent over a bandwidth-expanding communication system, that is, a method for performing both channel estimation and signal detection, said method allowing the design of digital receivers comprising a sampling device with reduced complexity and cost compared to the complexity and cost of the sampling devices of current digital receivers, while retaining equivalent decoding performances.

Another aim of the present invention is to provide a decoding method for signals sent over a bandwidth-expanding communication system, allowing the design of digital receivers with reduced computational requirements compared to the computational requirements of current digital receivers, while retaining equivalent decoding performances.

These aims are achieved by a decoding method and a related receiver comprising the features of the corresponding independent claims, features of preferred embodiments being described in the dependant claims.

In particular, the method according to the invention allows the decoding, that is, both channel estimation and signal detection, of a signal sent over a bandwidth-expanding communication system from a set of sampled values generated by sampling the received wideband signal with a sampling frequency lower than the sampling frequency given by the Shannon's sampling theorem, but greater than the rate of innovation p of said sent signal, thus allowing a receiver using this method to sample the received signal at a sub-Nyquist rate and still allowing an exact reconstruction of the sent signal.

With the method according to the invention, all the necessary computational steps for channel estimation and/or for signal detection are performed on the basis of a significantly reduced set of sampled values compared to the set of sampled values needed by current digital receivers, thus allowing a significant reduction of the computational requirements of the digital receiver using the method according to the invention compared to the computational requirements of current receivers having equivalent performances.

In particular, during the training phase, the method according to the invention allows estimation of the propagation parameters, that is, relative delays of different users' signals with respect to a reference in the receiver, propagation coefficients along the different propagation paths in the case when the communication system is subject to multipath fading and direction-of-arrival of the different signals, from a significantly reduced set of sampled values compared to the set of sampled values needed by current digital receivers.

The minimal sampling frequency required by the method according to the invention is determined by the rate of innovation p of the received signal. The rate of innovation p of a signal is defined as the number of degrees of freedom of the signal per unit of time. For example, in the case of a periodic stream of Z weighted pulses (Diracs) per period T, the signal is fully specified by the Z amplitudes and the Z locations of the Diracs of one period T. That is, the number of degree of freedom of this signal is 2Z per period T, and its rate of innovation is therefore $\rho=2Z/T$. In the case of a signal sent by a user k over a bandwidth-expanding communication channel, given a known spreading function, the wideband signal transmitted by said user k is entirely determined by the sent information or sent symbols. In the single-user case, the number of degrees of freedom of the received wideband signal is therefore equal to the number of degrees of freedom of the sent signal, that is the number of symbols sent, and the rate of innovation $\rho$ of the received signal is equal to the number of symbols sent by the user k per unit of time. The rate of innovation $\rho$ of the received signal y(t) is therefore equal to its symbol rate $1/T_b$, which, as explained before, is lower than its chip rate $1/T_c$ by the spreading factor. In the multi-user case, the rate of innovation of the received signal is equivalent to the addition of the rates of innovation of the K signals sent by the K users k. The rate of innovation $\rho$ of the received signal y(t) is then equal to the number K of symbols sent by the K users k per unit of time, the rate of innovation $\rho$ of the received signal y(t) is therefore equal to its information rate $K/T_b$. The number K of users k being typically significantly smaller than the spreading factor $N_c$, the rate of innovation p of the received signal is still significantly lower than its chip rate $1/T_c$.

The invention will be better understood with the help of the FIGS. 1 to 5.

FIG. 1 which has been previously described illustrates a CDMA system including a known analog receiver.

FIG. 2 diagrammatically represents a bandwidth-expanding communication channel, for example a CDMA system.

FIG. 5 illustrates the principle of an array of antennas.

In the following of the specification and claims, the terms communication system and communication channel are equally used, unless otherwise specified.

In its preferred embodiment, the decoding method according to the invention is applied to the decoding of a signal sent over a CDMA communication channel, said channel including a receiver using the method according to the invention.

Figure 1:
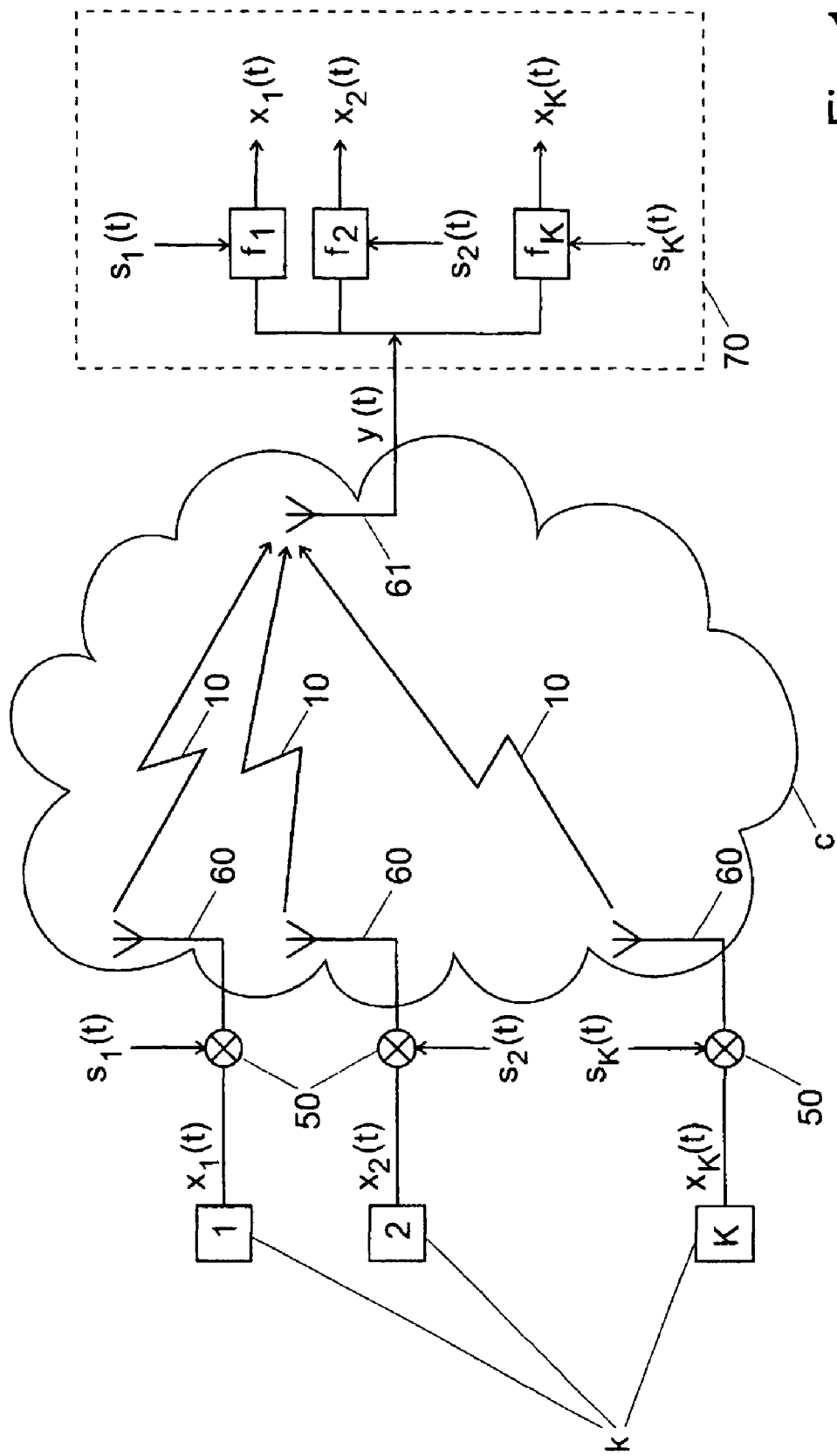
Figure 2:
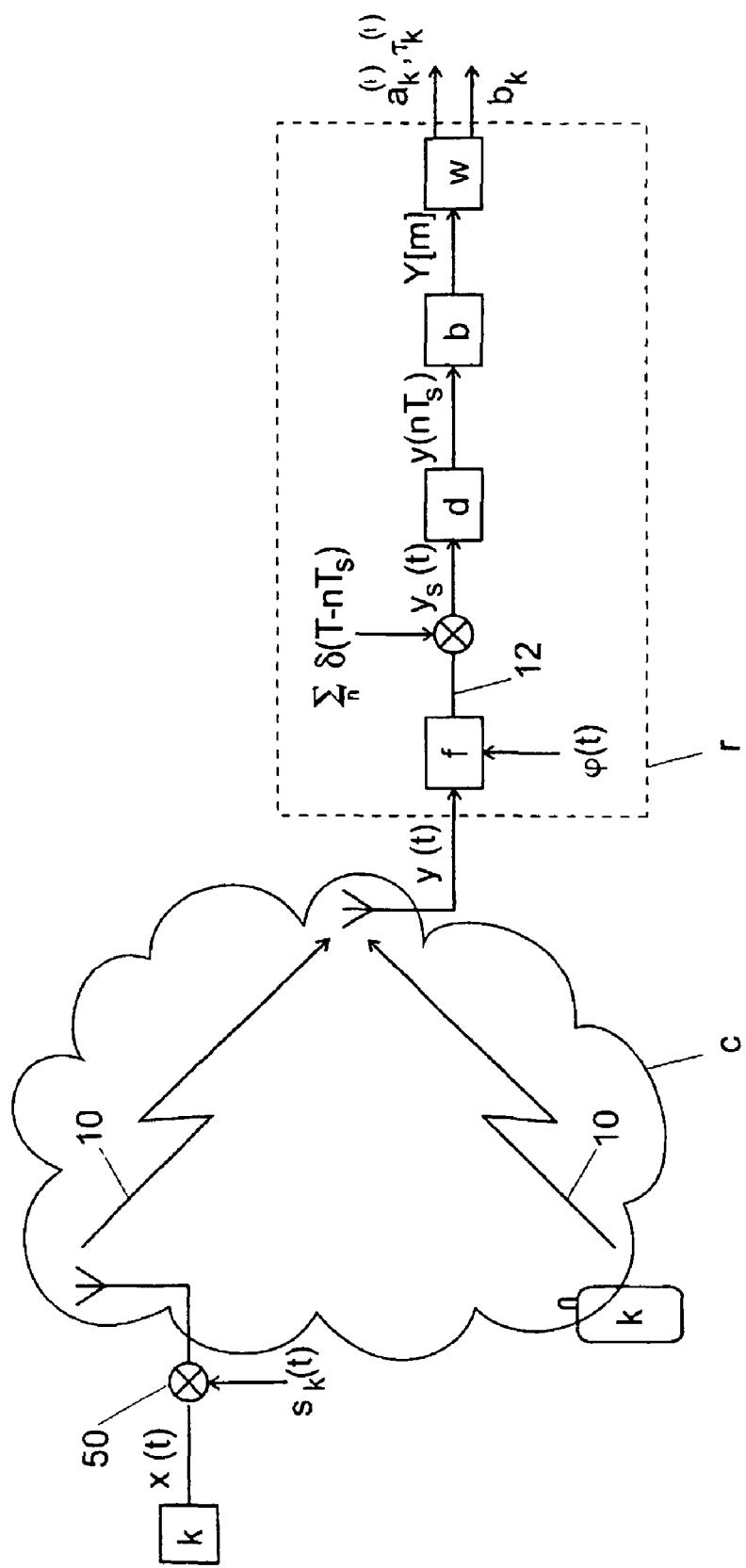

FIG. 2 diagrammatically represents a CDMA system with a number K of users k operating over a transmission channel c. The signal x(t) sent by each user k is encoded with the user specific coding sequence $s_k(t)$ by an encoder 50, thus generating a wideband signal 10. This wideband signal 10 is transmitted to the receiver r, for example using frequency or amplitude modulation of a carrier signal. At the receiver r, the received signal y(t) after demodulation is composed of the superposition of all wideband signals 10 transmitted by the K users k. The signal is filtered with a lowpass filter f, that is, it is convolved with a filtering signal $\phi(t)$, for instance a band-limited sinc signal. The filtered signal 12 is then sampled at a regular sampling frequency $f_s=1/T_s$, resulting in the time-continuous sampled signal $y_s(t)$. The sampled values $y[nT_s]$ are extracted from this time-continuous sampled signal $y_s(t)$ by a continuous-to-discrete converter d and the spectral values Y[m] of the time-continuous signal $y_s(t)$ are computed from these sampled values $y[nT_s]$, for instance by using the Fast Fourier Transform (FFT) method. The spectral values Y[m] are then used by the processing device w either to estimate the values of the propagation parameters of the transmission channel c during the training phase, or to retrieve the information sent by each user k in the detection phase, as explained below.

Figure 3:
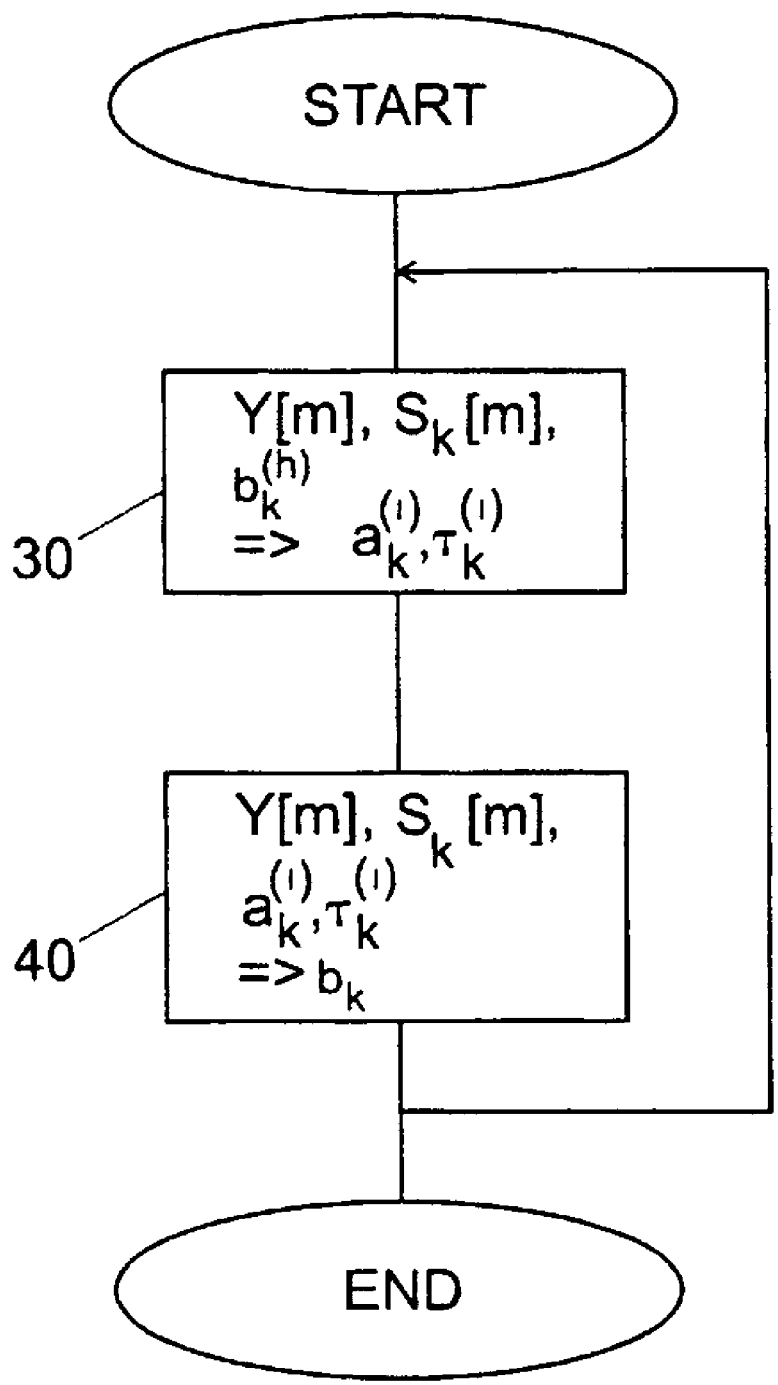
FIG. 3 illustrates the concept of multipath propagation from the emitter to the receiver within a transmission channel.

FIG. 3 diagrammatically represents the functioning of the processing device w, first during the training phase 30 and then during the subsequent detection phase 40.

During the training phase 30, the processing device w solves a one-dimensional estimation problem including a set of spectral values Y[m] of the sampled signal $y_s(t)$, the known spectral values $S_k[m]$ of each user's coding sequence $s_k(t)$ and the known values of the symbols $b_k^{(h)}$ of the training sequences $b_{kt}$ sent by each user k, in order to determine the propagation parameters of the transmission channel c. In the preferred embodiment of the method, the estimated propagation parameters are the delays $\tau_k^{(l)}$ and the amplitude attenuations $a_k^{(l)}$ induced by the transmission channel c on the signals sent by the users k, which in this phase are the coded training sequences $b_{kt}$, and transmitted along the different propagation paths l. The spectral values $S_k[m]$ of each user's coding sequence $s_k(t)$ can be computed by sampling said coding sequence $s_k(t)$ at the same sampling frequency $f_s$ as the one used for sampling the received signal y(t), and applying, for instance, the FFT method to the generated set of sampled values $s_k[nT_s]$. These spectral values $s_k[nT_s]$ can be stored for instance in a memory in the receiver r.

During the detection phase 40, the processing device w solves a second estimation problem including a second set of spectral values Y[m] of the sampled signal $y_s(t)$, the previously calculated values of the propagation parameters $a_k^{(l)}$ and $\tau_k^{(l)}$ and the known spectral values $S_k[m]$ of each user's coding sequence $s_k(t)$, in order to determine the information sent by the users k, that is the value of the sent symbols $b_K$.

Figure 4:
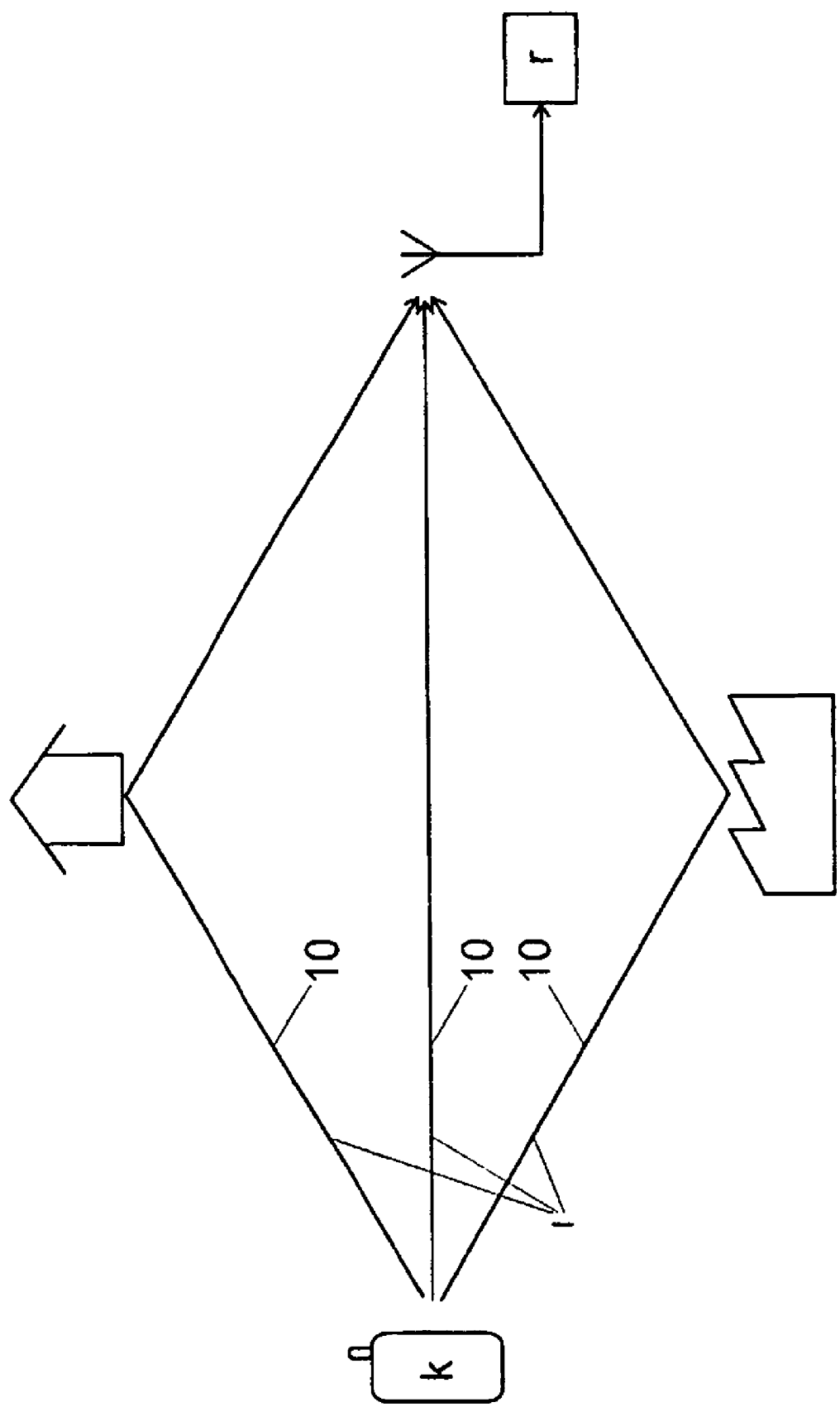
FIG. 4 represents the steps performed by the processing device w of a digital receiver r using the method according to the invention.

The concept of multipath fading transmission channel is illustrated by FIG. 4 which shows how a signal transmitted by a user k can follow different propagation paths l with different attenuation properties and propagation delays. Each copy of the transmitted signal 10 reaching the receiver r through a different propagation path l has therefore a possibly different complex amplitude attenuation $a_k^{(l)}$ and a possibly different relative delay $\tau_k^{(l)}$ with respect to a reference in the receiver r. The estimated maximal number of paths l that each transmitted signal 10 can follow within a transmission channel is at most equal to L. The transmission channel is assumed to vary slowly, which means that its propagation parameters $a_k^{(l)}$ and $\tau_k^{(l)}$ are considered constant during the whole training phase.

In the following, the preferred embodiment of the method according to the invention will be described in more detail and it will be demonstrated how the method according to the invention allows the decoding of a signal sent over a bandwidth-expanding communication system, by taking samples of the received signal y(t) with a sampling frequency $f_s$ lower than the sampling frequency given by Shannon's sampling theorem, but greater than the rate of innovation $\rho$ of said signal.

With the signature sequences $s_k(t)$ ($s_1(t), s_2(t), \ldots, s_K(t)$) assigned to each of the K users k and with $b_1, b_2, \ldots, b_K$ the symbols $b_k$ sent by the K users k during the duration $T_b$ of a symbol $b_k$, and assuming that there are at most L propagation paths l for each signal transmitted by a user k, the received signal y(t) during this period of time, after demodulation, can be expressed as:

$$y(t) = b_1[a_1^{(1)}s_1(t-\tau_1^{(1)}) + a_1^{(2)}s_1(t-\tau_1^{(2)}) + \ldots + a_1^{(L)}s_1(t-\tau_1^{(L)})] + \\ b_2[a_2^{(1)}s_2(t-\tau_2^{(1)}) + a_2^{(2)}s_2(t-\tau_2^{(2)}) + \ldots + a_2^{(L)}s_2(t-\tau_2^{(L)})] + \\ \ldots + b_K[a_K^{(1)}s_K(t-\tau_K^{(1)}) + a_K^{(2)}s_K(t-\tau_K^{(2)}) + \ldots + a_K^{(L)}s_K(t-\tau_K^{(L)})]$$

that is, the received signal y(t) is a superposition of multiple copies of the signals transmitted by the K users k over the transmission channel c, each copy having a possibly different amplitude attenuation $a_k^{(l)}$ and a possibly different relative delay $\tau_k^{(l)}$ with respect to a reference at the receiver r. The received signal y(t) can be written more compactly as $$y(t) = \sum_{k=1}^{K} b_k \sum_{l=1}^{L} a_k^{(l)} s_k(t-\tau_k^{(l)})$$

where $\tau_k^{(l)}$ denotes the delay with respect to a reference at the receiver r of the signal transmitted by user k along the propagation path l, and $a_k^{(l)}$ denotes a complex amplitude attenuation induced by the propagation path l that includes contributions from the attenuation of the transmission channel c and phase offset.

At the receiver r, the received signal y(t) is filtered with a lowpass filter f. In the preferred embodiment of the method of the invention, the received signal y(t) is filtered with the filter f having the impulse response $\phi(t)$, where $\phi(t)$ is for instance a sinc signal of bandwidth $|-M\omega_0, M\omega_0|$, where $\omega_0 = 2\pi/T_b$.

The sampling period $T_s$ is chosen such that $T_b/T_s \geq 2M+1$. A set of at least 2M+1 samples $y[nT_s]$ is thus generated during each symbol period $T_b$. From the set of samples, 2M+1 spectral values Y[m], where m∈[−M,M], can be computed, for instance with the use of the Fast Fourier Transform (FFT) method.

$$Y[m] = \sum_{k=1}^{K} b_k \sum_{l=1}^{L} a_k^{(l)} S_k[m] e^{-jm\omega_0 \tau_k^{(l)}}$$

The delays $\tau_k^{(l)}$ of the transmitted signals along the different propagation paths l appear in the spectral coefficients Y[m] as phase delays, while the complex amplitude attenuations $a_k^{(l)}$ appear as the weighting coefficients.

The above equation can be written more compactly as $$Y[m] = \sum_{k=1}^{K} b_k c_{mk}$$

where $c_{mk}$ are given by $$c_{mk} = S_k[m] \sum_{l=1}^{L} \left( a_k^{(l)} e^{-jm\omega_0 \tau_k^{(l)}} \right)$$

or in a matrix form $$\begin{pmatrix} c_{11} & c_{12} & \ldots & c_{1K} \\ c_{21} & c_{22} & \ldots & c_{2K} \\ \vdots & & & \vdots \\ c_{M1} & c_{M2} & \ldots & c_{MK} \end{pmatrix} \begin{pmatrix} b_1 \\ b_2 \\ \vdots \\ b_K \end{pmatrix} = \begin{pmatrix} Y[1] \\ Y[2] \\ \vdots \\ Y[M] \end{pmatrix} \equiv C \cdot b = Y$$

During the training phase 30, the values of the symbols $b_k$ sent by the users k are known and the linear system above has to be solved for the elements of the matrix C, in order to estimate the delays $\tau_k^{(l)}$ and amplitude attenuations $a_k^{(l)}$ of the transmitted signals 10.

However, the linear system above alone, generated from the sampled values $y[nT_s]$ of the received signal y(t) taken during one symbol duration $T_b$, is not sufficient to solve for all the elements of the matrix C. Since the matrix C is of a size M×K, it is necessary to have at least K such equations, that can be obtained by considering at least K set of samples $y[nT_s]$ taken from the received signal y(t) during at least K symbol durations $T_b$. In other words, in order to solve for C, given b and Y, each user k has to send a training sequence $b_{kt}$, where $$b_{1t} = [b_1^{(1)} \ b_1^{(2)} \ \ldots \ b_1^{(H)}]$$
$$b_{2t} = [b_2^{(1)} \ b_2^{(2)} \ \ldots \ b_2^{(H)}]$$
$$\vdots$$
$$b_{Kt} = [b_K^{(1)} \ b_K^{(2)} \ \ldots \ b_K^{(H)}]$$

The length H of each training sequence $b_{kt}$, which is the number H of symbols $b_k^{(h)}$, is at least K, where K denotes the number of users k.

The equation system to be solved by the processing device w of the receiver r can thus be written as $$\begin{pmatrix} c_{11} & c_{12} & \ldots & c_{1K} \\ c_{21} & c_{22} & \ldots & c_{2K} \\ \vdots & & & \\ c_{M1} & c_{M2} & \ldots & c_{MK} \end{pmatrix} \begin{pmatrix} b_1^{(1)} & b_1^{(2)} & \ldots & b_1^{(K)} \\ b_2^{(1)} & b_2^{(2)} & \ldots & b_2^{(K)} \\ \vdots & & & \\ b_K^{(1)} & b_K^{(2)} & \ldots & b_K^{(K)} \end{pmatrix} =$$

$$\begin{pmatrix} Y^{(1)}[1] & Y^{(2)}[1] & & Y^{(K)}[1] \\ Y^{(1)}[2] & Y^{(2)}[2] & & Y^{(K)}[2] \\ & & & \\ Y^{(1)}[M] & Y^{(2)}[M] & & Y^{(K)}[M] \end{pmatrix} \equiv C \cdot B =$$

This can be solved for C as $$C = Y \cdot B^{-1}$$

The above equation provides a unique solution as long as B is a full rank matrix. B is the matrix made up of the known training sequences $b_{kt}$ of all users k and, as long as these training sequences $b_{kt}$ are linearly independent, the matrix B will be a full rank matrix. In other words, each user k must send a determined training sequence $b_{kt}$, stored for instance in a memory storage device in the corresponding encoder 50, linearly independent from any training sequence $b_{kt}$ sent by any other user k.

From the above equation all the coefficients $c_{mk}$ can be calculated.

$$c_{mk} = S_k[m] \sum_{l=1}^{L} \left( a_k^{(l)} e^{-jm\omega_0 \tau_k^{(l)}} \right)$$

Since the spectral values $S_k[m]$ of the coding sequences $s_k(t)$ are known weighting coefficients, a new matrix D can be defined by $$D = \begin{pmatrix} c_{11}/S_1[1] & c_{12}/S_2[1] & \ldots & c_{1K}/S_K[1] \\ c_{21}/S_1[2] & c_{22}/S_2[2] & \ldots & c_{2K}/S_K[2] \\ \vdots & & & \\ c_{M1}/S_1[M] & c_{M2}/S_1[1] & \ldots & c_{MK}/S_K[M] \end{pmatrix}$$

with $d_{mk} = c_{mk}/S_k[m]$. The coefficients $d_{mk}$ are thus given by $$d_{mk} = \sum_{l=1}^{L} a_k^{(l)} e^{-jm\omega_0 \tau_k^{(l)}}$$

With the number $M \geq 2L$ then the k-th column of D provides sufficient information to solve uniquely for the channel parameters of the user k. For example, considering the first column of D:

$$d_{11} = a_1^{(1)} e^{-j\omega_0 \tau_1^{(L)}} + a_1^{(2)} e^{-j\omega_0 \tau_1^{(2)}} + \ldots + a_1^{(L)} e^{-j\omega_0 \tau_1^{(L)}}$$

$$d_{21} = a_1^{(1)} e^{-j2\omega_0 \tau_1^{(L)}} + a_1^{(2)} e^{-j2\omega_0 \tau_1^{(2)}} + \ldots + a_1^{(L)} e^{-j2\omega_0 \tau_1}$$

$$\ldots$$

$$d_{2L1} = a_1^{(1)} e^{-j2L\omega_0 \tau_1^{(L)}} + a_1^{(2)} e^{-j2L\omega_0 \tau_1^{(2)}} + \ldots + a_1^{(L)} e^{-j2L\omega_0 \tau_1^{(L)}}$$

Only the unknown propagation parameters of the first user appear in the above set of equations. In other words, the propagation parameters $\tau_k^{(l)}$ and $a_k^{(l)}$ of user k can be perfectly estimated, in the noiseless case, from the k-th column of matrix D. The problem of multiuser channel estimation is therefore decomposed into a series of one-dimensional estimation problems that can be efficiently solved for instance using known 1-D subspace methods for harmonic retrieval.

It is thus demonstrated that the method of the invention allows, during the training phase 30, the estimation of the propagation parameters $\tau_k^{(l)}$ and $a_k^{(l)}$ for all users k from a lowpass filtered version of the received wideband signal y(t) sampled at a sub-Nyquist rate, which implies that the sampling frequency $f_s$ as well as the computational requirements at the receiver's side can be significantly reduced in comparison to the sampling frequency and the computational requirements induced by current methods.

The number of samples M needed per symbol $b_k^{(h)}$ depends only on the number L of multipaths l, while the number H of symbols $b_k^{(h)}$ in each training sequence $b_{kt}$ depends on the number K of users k that need to be synchronized. In the noiseless case, the method according to the preferred embodiment of the invention leads to a perfect estimation of channel parameters $a_k^{(l)}$ and $\tau_k^{(l)}$ of all users k by taking only $M = 2L+1$ samples Y[m] per symbol $b_k^{(h)}$. This means that the sampling frequency $f_s$ must be at least greater than 2L times the symbol rate:

$$f_s = \frac{1}{T_s} > \frac{2L}{T_b}$$

During the training phase 30, the values of the sent bits $b_k^{(h)}$ of the training sequences $b_{kt}$ being known, the degrees of freedom of the received signal y(t) are the set of unknown propagation parameters, that is the KL delays $\tau_k^{(l)}$ and the KL amplitude attenuations $a_k^{(l)}$ that the K transmitted signals 10 can take along their L propagation paths 1. The number of degrees of freedom of the received signal y(t) is thus 2KL. Since the propagation parameters are constant over the entire training phase 30, and since at least K bits $b_k^{(h)}$ of the training sequences $b_{kt}$ are known, the number of degrees of freedom of the received signal y(t) stays constant over the entire training phase, which is at least $KT_b$ long. The rate of innovation p of the received signal y(t) can therefore be expressed as $$\rho = \frac{2KL}{KT_b} = \frac{2L}{T_b}$$

Thus it is demonstrated that the sampling frequency has to be higher than the rate of innovation of the signal.

$$\frac{1}{T_s} = f_s > \rho = \frac{2L}{T_b}$$

In a CDMA communication system, the symbol rate $1/T_b$ is typically considerably lower than the received signal's chip rate $1/T_c$. The inventive method thus significantly reduces the required sampling frequency $f_s$ in comparison to current methods typically requiring digital receivers to sample the received signal at least at its chip rate $1/T_c$.

Consequently, the number of sampled values required by the inventive method for estimating the propagation parameters is also significantly reduced, reducing the complexity of the estimation problem to be solved and thus reducing the computational requirements for the processing device w of the digital receiver r compared to the computational requirements for receivers using prior art methods.

As already mentioned, the training sequences $b_{kt}$ sent by the users k during the training phase 30 have to be carefully chosen so as to ensure the good performance of the inventive method for channel estimation. Therefore, the training sequence $b_{kt}$ to be sent by each user k is chosen from a set of training sequences specifically designed to optimize the performance of the channel estimation and stored in the corresponding encoder 50. Preferably, the encoder 50 can store at least two different training sequences $b_{kt}$ from this set. During the training phase 30, the user k sends the stored training sequence $b_{kt}$ most adapted to the current characteristics of the communication channel, basing for instance on a feedback message from the receiver r.

In the noisy case, in order to obtain a more precise estimation of the propagation parameters $a_k^{(l)}$ and $\tau_k^{(l)}$, the sampling frequency $f_s$ needs to be increased, while the length H of the training sequences $b_{kt}$ remains the same. In the presence of noise, the sampling frequency $f_s$ required for good estimation accuracy depends on signal-to-noise ratio (SNR), yet in most cases encountered in practice that sampling frequency $f_s$ is still far below the chip rate $1/T_c$.

In a variant preferred embodiment, the method described above during the training phase 30 is applied to an asynchronous CDMA communication system where the receiver r has an arbitrary timing reference that is not aligned to transmitted symbol $b_k^{(h)}$ boundaries. Therefore, in the general case, the sample values $y_s[nT_s]$ from which the Fourier series coefficients Y[m] are computed, will actually contain the information about two consecutive bits in the training sequence, provided that a maximum delay spread of each user k is less than a symbol duration $T_b$. As a result, the computed Fourier series coefficients Y[m] may not correspond to the actual values, in particular in the case when the adjacent bits have different signs. It is thus desirable to repeat every bit $b_k^{(h)}$ in the training sequence $b_{kt}$ twice during the training phase, to make sure that the Fourier series coefficients Y[m] are computed accurately. This does not imply that the derived equations should be modified. All the equations remain the same, the only difference is that every bit $b_k^{(h)}$ in the training sequences $b_{kt}$ is sent twice.

Once the propagation parameters $a_k^{(l)}$ and $\tau_k^{(l)}$ of the transmission channel c for all users k have been estimated, the processing device w of the receiver r proceeds to the detection phase 40, that is, the detection of the signal x(t), or the symbols $b_k$, sent by each user k.

According to the preferred embodiment of the invention, the detection phase 40 is performed using known multiuser detection methods such as Minimum Mean Square Error (MMSE) or decorrelating detector. The received signal y(t) however is, as in the training phase 30, first filtered with a lowpass filter f and then sampled at a sub-Nyquist rate, that is, at a sampling frequency $f_s$ lower than the chip rate $1/T_c$ of the received signal y(t), but higher than its rate of innovation $\rho$. The inventive method base on the surprising finding that a set of sampled values generated from a signal at a sub-Nyquist rate is sufficient to reconstruct or to decode said signal, if said set of sampled values is generated at a sampling frequency $f_s$ higher than the signal's rate of innovation $\rho$.

During the detection phase 40, the receiver r receives a second signal y(t) made of the superposition of multiple copies of information signals x(t) sent over the communication channel by the users k, each copy of each information signal x(t) having a previously estimated amplitude attenuation $a_k^{(l)}$ and a previously estimated relative delay $\tau_k^{(l)}$ with respect to a reference at the receiver r. The information signals x(t) sent by the users k are made of symbols $b_k$. These symbols $b_k$ are then coded with the respective coding sequence $s_k(t)$, and transmitted to the receiver r over the transmission channel c. The second signal y(t) is first filtered and then sampled at a sampling frequency $f_s$ lower than the sampling frequency given by the Shannon theorem, but higher than rate of innovation $\rho$ of the second signal y(t), which is, as described above in the multi-user case, equal to the signal's information rate $K/T_b$, thus generating a second set of sampled values $y[nT_s]$. Signal detection is then performed with known detection methods such as for instance Minimum Mean Square Error (MMSE) or decorrelating detector, using the values of the second set sampled values $y[nT_s]$ and the previously estimated propagation parameters $a_k^{(l)}$ and $\tau_k^{(l)}$.

In a variant preferred embodiment of the method, the training phase 30 is initiated as described previously. The coefficients $c_{mk}$ of the matrix C are computed with $$C = Y \cdot B^{-1}$$

However, once the matrix C is computed, the system proceeds to the subsequent detection phase 40 without solving the series of one-dimensional estimation problems for estimating each propagation parameter $a_k^{(l)}$ or $T_k^{(l)}$. During the detection phase 40, the second signal y(t) is sampled as described in the previous embodiment of the method, thus generating a second set of sampled values $y[nT_s]$ from which a second set of spectral values Y[m] can be computed with for instance the FFT method.

The linear system $$\begin{pmatrix} c_{11} & c_{12} & \ldots & c_{1K} \\ c_{21} & c_{22} & \ldots & c_{2K} \\ \vdots & & & \\ c_{M1} & c_{M2} & \ldots & c_{MK} \end{pmatrix} \begin{pmatrix} b_1 \\ b_2 \\ \vdots \\ b_K \end{pmatrix} = \begin{pmatrix} Y[1] \\ Y[2] \\ \vdots \\ Y[M] \end{pmatrix} \equiv C \cdot b = Y$$

is then solved for b in order to determine the value of the symbols $b_k$, with all coefficients $c_{mk}$ being known from the synchronization phase. Therefore, the vector containing the bits sent by each user can be computed as $$\begin{pmatrix} b_1 \\ b_2 \\ \vdots \\ b_K \end{pmatrix} = \begin{pmatrix} c_{11} & c_{12} & \ldots & c_{1K} \\ c_{21} & c_{22} & \ldots & c_{2K} \\ \vdots & & & \\ c_{M1} & c_{M2} & \ldots & c_{MK} \end{pmatrix}^{-1} \begin{pmatrix} Y[1] \\ Y[2] \\ \vdots \\ Y[M] \end{pmatrix} \equiv b = C^{-1} \cdot Y$$

In other words, it is possible to detect user's signals without knowing specific users' signature sequences and without even estimating the propagation coefficients $a_k^{(l)}$ and $\tau_k^{(l)}$. The receiver only has to estimate the matrix C during the training phase, while during the detection phase the vector of bits b is simply given by the linear system above. This preferred embodiment of the method thus significantly reduces the computational requirements for the computing device w of a receiver r using said method. However, it can only be satisfactorily applied to quasi-synchronous CDMA communication systems where the timings of the users k are a priori known to the receiver, and where the maximum delay spread of each user k is much smaller than a symbol duration $T_b$.

As mentioned above, during the detection phase 40, the number of degrees of freedom of the second signal y(t) is equal to the number K of symbols $b_k$ sent by the users k. The rate of innovation ρ of the second signal y(t) is then equal to its information rate $K/T_b$. The sampling frequency $f_s$ must then be $$\frac{1}{T_s} = f_s > \rho = \frac{K}{T_b}$$

which is still well below the chip rate $1/T_c$ of the received signal.

In the case of noisy transmission, the propagation parameters $a_k^{(l)}$ and $\tau_k^{(l)}$ of the transmission channel c and consequently the transmitted symbols $b_k$ can not be estimated perfectly. In order to perform a better estimation of these channel parameters and therefore a less bit error rate, the sampling frequency $f_s$ should be higher than the rate of innovation ρ. The sampling frequency $f_s$ required for good estimation accuracy will then depend on signal-to-noise ratio (SNR), yet in most cases encountered in practice, that sampling frequency $f_s$ is still far below the chip rate $1/T_c$.

In a variant preferred embodiment of the method, the filtering signal φ(t) is a Gaussian signal. Since the Gaussian signal has an exponential decay, the problem of intersymbol interference, which can potentially arise with the use of a sinc filtering signal, can be avoided.

In another variant preferred embodiment, the method according to the invention is applied to a CDMA system where the receiver r is connected to an array of antennas (FIG. 5). The array of antennas is composed of a regularly spaced aligned antennas i. After demodulation, the signal $y_i(t)$ received by each antenna i is a superposition of multiple copies of the signals transmitted by the K users k over the transmission channel c, each copy having a possibly different amplitude attenuation and a possibly different relative delays with respect to a reference at the receiver r. Each copy arrives at the antenna array at the incident angle $\theta_k^{(l)}$ which is the same for all antennas i in the array. However, there will be a fixed phase difference of $$e^{\frac{j\omega_c D \sin\theta_k^{(l)}}{c}} = e^{j\phi_k^{(l)}}$$

between the copies received at each two consecutive antennas i, where D denotes the spacing between two adjacent antennas, $\omega_c$ is the carrier angular frequency and c is the speed of light. This holds under the assumption that the carrier frequency is relatively high compared to the bandwidth of the transmitted signal, which is typically true in practical cases.

The copies of the same signal component received by each two consecutive antennas i are thus shifted by a fixed phase delay that depends on the direction of arrival $\theta_k^{(l)}$ of the specific signal component. Thus, the same phase difference will exist between the Fourier series coefficients of the same signal component received by each two consecutive antennas i.

During the training phase 30, each signal $y_i(t)$ received by each antenna i is, as in the previously described embodiments of the method, first filtered with a lowpass filter f and then sampled at a frequency $f_s$ higher than the innovation rate ρ of the signal $y_i(t)$, but lower than the frequency given by Shannon's sampling theorem. As previously described, sets of spectral values $Y_i[m]$ are then computed from each generated set of sampled values $y_i[nT_s]$, for computing a matrix $D_i$ with each said set of spectral values $Y_i[m]$, with the known values of the bits $b_k^{(h)}$ of the training sequences $b_{kt}$ and with the known spectral values $S_k[m]$ of the coding sequences $s_k(t)$. The elements $d_{mn}^i$ of the computed matrices $D_i$ are therefore given by $$d_{mk}^i = \sum_{l=1}^{L} \left(a_k^{(l)} e^{-jm\omega_0 \tau_k^{(l)}}\right) A_g e^{-j(i-1)\phi_k^{(l)}}$$

where $A_g$ denotes the antenna gain (assumed to be the same for all antennas). The unknown propagation parameters $\tau_k^{(l)}$, $\theta_k^{(l)}$ and $a_k^{(l)}$ of the user k can then be estimated by considering only the k-th columns of the matrices $D_i$. Thus, for each user k, a matrix $F_k$ made up of the k-th column of each matrix $D_i$ is defined by $$F_k = (D_1(:,k) \quad D_2(:,k) \quad D_3(:,k) \quad \ldots \quad D_I(:,k))$$

$$= \begin{pmatrix} d_{1k}^1 & d_{1k}^2 & \ldots & d_{1k}^I \\ d_{2k}^1 & d_{2k}^2 & \ldots & d_{2k}^I \\ \vdots & & & \\ d_{Mk}^1 & d_{Mk}^2 & \ldots & d_{Mk}^I \end{pmatrix}$$

From the matrix $F_k$ it is then solved for the propagation parameters $\tau_k^{(l)}$, $\theta_k^{(l)}$ and $a_k^{(l)}$ of user k, for instance using 2-D subspace methods for harmonic retrieval. Therefore, by repeating this operation for all users k, the unknown propagation parameters $\tau_k^{(l)}$, $\theta_k^{(l)}$ and $a_k^{(l)}$ of all users k can be estimated. The problem of multiuser parameter estimation is in this case decomposed into a series of 2-D estimation problems.

The one skilled in the art will recognize that it is also possible to estimate all the propagation parameters $\tau_k^{(l)}$, $\theta_k^{(l)}$ and $a_k^{(l)}$ of the user k by considering only the first two columns of the matrix $F_k$, that is, by considering the signals from only two antennas i, and using for instance 1-D subspace methods, which could further reduce the computational requirements. However, this last variant embodiment of the method typically leads to less reliable estimation of the propagation parameters than the previous one.

In the detection phase, beams of antenna arrays are oriented according to the previously estimated directions of arrival and detection is performed for instance with the known 2-D RAKE method but on a lowpass filtered version of the received signals $y_i(t)$ sampled at a sampling frequency f, higher than the innovation rate ρ of the received signals $y_i(t)$, but lower than the frequency given by Shannon's sampling theorem.

In a further preferred embodiment, the inventive method is applied to a CDMA communication system using a specific set of coding sequences $s_k(t)$ that are orthogonal to each other on their lowpass filtered version. In this preferred embodiment, the training phase 30 is performed as described in the previous embodiments. The detection phase 40 is performed by first filtering the received signal y(t) with a filter f and then sampling it at a frequency $f_s$ lower than the frequency given by Shannon's sampling theorem, but higher than the rate of innovation p of the received signal y(t), for generating a set of sampled values $y[nT_s]$. These sampled values $y[nT_s]$ are then processed by a bank of digital matched filters, each matched to the sampled lowpass filtered version of a user's coding sequence $s_k(t)$. As the lowpass filtered versions of the coding sequence $s_k(t)$ of the users k are orthogonal to each other, the output of each matched filter determines the value of the information sent by the corresponding user k.

The method according to the invention was demonstrated above for the case of a CDMA system with K users k transmitting over a multipath fading transmission channel c. The one skilled in the art will however recognize that the inventive method can also be applied to communication systems with transmission channels having a single propagation path as well as for single-user channel estimation.

In the preferred embodiments described above, the method according to the invention and the related receiver using said method are applied to CDMA communication systems. The one skilled in the art will however recognize that the method according to the invention can be applied to other bandwidth-expanding communication systems, such as ultra wideband systems (UWB). More precisely, UWB system can be roughly considered as a special case of CDMA systems where the signature sequence assigned to a user is a very short pulse, much shorter than the bit duration $T_b$. In the typical practical case, this pulse is a first derivative Gaussian function.

The typical implementation of an UWB communication system is a pulse position modulation system (PPM system) using a wideband pulse shape. In such systems, in order to recover the information contained in the received signal, it is necessary to estimate the locations of the transmitted pulses. The one skilled in the art will recognize that this task can be viewed as a particular case of the time-delay estimation described above during the training phase in the case of a CDMA system.

During the training phase, a user sends a stream of regularly spaced pulses in order to allow for the receiver to estimate, in a similar manner to what is described above, the propagation parameters, that is, the relative time delays induced by the channel $\tau^{(l)}$ as well as the propagation coefficients $a^{(l)}$. During the detection phase, the receiver has to solve the same time-delay estimation problem as in the preceding training phase. In order to recover the information sent, the previously estimated time delays induced by the channel must be subtracted form the time delays estimated in the detection phase.

The inventive method, in its various preferred embodiments, is described above for performing both channel estimation during the training phase and signal detection during the detection phase. It is however possible to implement the inventive method in a bandwidth-expanding communication system for performing only channel estimation and to use a method known from the prior art for performing signal detection, or to implement the inventive method in a bandwidth-expanding communication system for performing only signal detection and to use a method known from the prior art for performing channel estimation.

The invention claimed is:

1. Method for processing a signal (y(t)) sent over a wireless communication channel, comprising
   sampling the received signal (y(t)) with a sampling frequency ($f_s$) lower than the sampling frequency given by the Shannon theorem, lower than the chip rate ($1/T_c$) of said received signal (y(t)), but greater than the rate of innovation (ρ) of said received signal (y(t)), for generating a set of sampled values (y($nT_s$))
   reconstructing the received signal (y(t)) using the set of sampled values (y($nT_s$)).

2. Method according to claim 1, further comprising filtering said received signal (y(t)) with a filter (f).

3. Method according to claim 2, wherein said filter (f) is a lowpass filter.

4. Method according to claim 3, wherein said filter (f) is a sinc filter.

5. Method according to claim 3, wherein said filter (f) is a Gaussian filter.

6. Method according to claim 1, wherein said wireless communication channel comprises a multipath fading transmission channel (c).

7. Method according to claim 1, wherein said wireless communication channel comprises a CDMA channel.

8. Method according to claim 1, wherein said sampling frequency ($1/T_s$) is greater than the information rate ($K/T_b$) of said received signal (y(t)).

9. Method according to claim 1, wherein said sent signal (y(t)) includes a plurality of training sequences ($b_{kt}$) each encoded with a user specific coding sequence ($s_k(t)$) and transmitted by said users (k), said method further comprising:
   computing a set of spectral values (Y[m]) corresponding to said received signal (y(t)) from said set of sampled values (y($nT_s$)),
   recovering spectral values ($S_k[m]$) corresponding to each of said user specific coding sequence ($s_k(t)$),
   retrieving the delays ($\tau_k^{(l)}$) and the amplitude attenuations ($a_k^{(l)}$) induced by said communication channel on said sent signal (y(t)), from said set of spectral values (Y[m]) corresponding to said received signal (y(t)) and from said spectral values ($S_k[m]$) corresponding to each of said user specific coding sequence ($s_k(t)$).

10. Method according to claim 9, wherein retrieving said delays ($\tau_k^{(l)}$) and said amplitude attenuations ($a_k^{(l)}$) includes solving a series of one-dimensional estimation problems, the size of each said one-dimensional estimation problem being equal to the number of said sampled values (y($nT_s$)) generated during one symbol duration ($T_b$).

11. Method according to claim 10, wherein said series of one-dimensional equation systems is derived from said spectral values (Y[m]) of said received signal (y(t)), said spectral values ($S_k[m]$) of each of said user specific coding sequence ($s_k(t)$) and the value of the bits ($b_k^{(h)}$) of said training sequences ($b_{kt}$).

12. Method according to claim 11, further comprising:
   processing a second sent signal (y(t)) including a plurality of symbols ($b_k$) each encoded with said user specific coding sequence ($s_k(t)$) and transmitted by said users (k),
   sampling said second sent signal (y(t)) with a sampling frequency lower than the sampling frequency given by the Shannon theorem, but greater than the rate of innovation (ρ) of said second sent signal (y(t)), for generating a second set of sampled values (y($nT_s$)).

13. Method according to claim 12, further comprising running a multiuser detection scheme using said second set of sampled values (y($nT_s$)) and previously computed said delays ($\tau_k^{(l)}$) and said amplitude attenuations ($a_k^{(l)}$) for estimating the value of the symbol ($b_k$) sent by each said user (k).

14. Method according to claim 13, wherein said multiuser detection scheme is a decorrelating detection scheme.

15. Method according to claim 13, wherein said multiuser detection scheme is a minimum mean-square error detection scheme.

16. Method according to claim 1, wherein said sent signal (y(t)) includes a plurality of symbols ($b_k$) each encoded with said user specific coding sequence ($s_k(t)$) and transmitted by said users (k), said method further comprising:
running a multiuser detection scheme using known delays ($\tau_k^{(l)}$) and amplitude attenuations ($a_k^{(l)}$) induced by said wireless communication channel on said sent signal (y(t)) and using said set of sampled values (y($nT_s$)) and for estimating the value of the symbol ($b_k$) sent by each said user (k).

17. Method according to claim 16, wherein said multiuser detection scheme is a decorrelating detection scheme.

18. Method according to claim 16, wherein said multiuser detection scheme is a minimum mean-square error detection scheme.

19. Method according to claim 1, wherein said sent signal (y(t)) includes a plurality of training sequences ($b_{kt}$) each encoded with a user specific coding sequence ($s_k(t)$) and transmitted by said users (k), said method further comprising:
computing a set of spectral values (Y[m]) of said received signal (y(t)) from said set of sampled values (y($nT_s$)),
computing a set of channel dependant values (C) from said set of spectral values (Y[m]) and said training sequences ($b_{kt}$),
processing a second sent signal (y(t)) including a plurality of symbols ($b_k$) each encoded with said user specific coding sequence ($s_k(t)$) and transmitted by said users (k),
sampling said second sent signal (y(t)) with a sampling frequency lower than the sampling frequency given by the Shannon theorem, but greater than the rate of innovation ($\rho$) of said second sent signal (y(t)), for generating a second set of sampled values (y($nT_s$))
retrieving the value of the symbol ($b_k$) sent by each said user (k) by solving a linear matrix system including said second set of sampled values (y($nT_s$)) and said set of channel dependant values (C).

20. Method according to claim 1, wherein said sent signal (y(t)) includes a plurality of symbols ($b_k$) each encoded with said user specific coding sequence ($s_k(t)$) and transmitted by said users (k), said user specific coding sequence ($s_k(t)$) being chosen such that, when filtered with a lowpass filter (f), it is orthogonal to any other user's specific coding sequence ($s_k(t)$) used in said communication channel and filtered with said lowpass filter (f), said method further comprising:
sampling said sent signal (y(t)) with a sampling frequency lower than the sampling frequency given by the Shannon theorem, but greater than the rate of innovation ($\rho$) of said sent signal (y(t)), for generating a set of sampled values (y($nT_s$))
filtering said set of sampled values (y($nT_s$)) with a bank of matched filters, each filter being matched to said user specific coding sequence ($s_k(t)$) filtered with said lowpass filter (f), for estimating the value of the symbol ($b_k$) sent by each said user (k).

21. Method according to claim 1, wherein said wireless communication channel comprises an array of antennas (i).

22. Method according to claim 21, wherein said sent signal (y(t)) is the superposition of a plurality of training sequences ($b_{kt}$) each encoded with a user specific coding sequence ($s_k(t)$) and transmitted by said users (k), said method further comprising:
sampling the received signals ($y_i(t)$) received by each antenna (i) in the antenna array with a sampling frequency ($f_s$) lower than the sampling frequency given by the Shannon theorem, but greater than the rate of innovation ($\rho$) of said received signals ($y_i(t)$), for generating sets of sampled values ($y_i(nT_s)$),
computing sets of spectral values ($Y_i[m]$) of said received signals ($y_i(t)$) from said sets of sampled values ($y_i(nT_s)$),
recovering the spectral values ($S_k[m]$) of each of said user specific coding sequence ($s_k(t)$),
retrieving the delays ($\tau_k^{(l)}$), the amplitude attenuations ($a_k^{(l)}$) and the directions of arrival ($\theta_k^{(l)}$) induced by said communication channel on said sent signal (y(t)) from said sets of spectral values ($Y_i[m]$) corresponding to said received signals ($y_i(t)$) and from said spectral values ($S_k[m]$) corresponding to each of said user specific coding sequence ($s_k(t)$).

23. Method according to claim 22, wherein retrieving said delays ($\tau_k^{(l)}$), said amplitude attenuations ($a_k^{(l)}$) and said directions of arrival ($\theta_k^{(l)}$) includes solving a series of two-dimensional estimation problems, the size of each said two-dimensional estimation problem being equal to the number of said sampled values ($y_i(nT_s)$) generated during one symbol duration ($T_b$).

24. Method according to claim 23, wherein said series of two-dimensional equation systems is derived from said spectral values ($Y_i[m]$) of said received signal ($y_i(t)$), said spectral values ($S_k[m]$) of each of said user specific coding sequence ($s_k(t)$) and the value of the bits ($b_k^{(h)}$) of said training sequences ($b_{kt}$).

25. Method according to claim 24, further comprising:
processing a second sent signal (y(t)) including a plurality of symbols ($b_k$) each encoded with said user specific coding sequence ($s_k(t)$) and transmitted by said users (k),
orienting the beams of said array of antennas (i) towards previously determined said arrival directions ($\theta_k^{(l)}$),
sampling said second sent signal (y(t)) with a sampling frequency lower than the sampling frequency given by the Shannon theorem, but greater than the rate of innovation ($\rho$) of said second sent signal (y(t)), for generating a second set of sampled values (y($nT_s$)).

26. Method according to claim 25, further comprising running a 2D-RAKE detection scheme using said second set of sampled values (y($nT_s$)) and previously computed said delays ($\tau_k^{(l)}$) and said amplitude attenuations ($a_k^{(l)}$) for estimating the value of the symbol ($b_k$) sent by each said user (k).

27. Method according to claim 1, wherein said wireless communication channel comprises an Ultra Wideband (UWB) communication channel.

28. A non-transitory computer-readable medium on which is recorded a control program for a data processor, the computer-readable medium comprising instructions for causing the data processor to:
sample a signal (y(t)) sent over a wireless communication channel with a sampling frequency ($f_s$) lower than the sampling frequency given by the Shannon theorem, lower than the chip rate ($1/T_c$) of said signal (y(t)), but greater than the rate of innovation ($\rho$) of said signal (y(t)), for generating a set of sampled values (y($nT_s$)) and
reconstruct the received signal (y(t)) using the set of sampled values (y($nT_s$)).

29. Receiver for decoding a signal (y(t)) sent over a bandwidth-expanding communication system according to the method of claim 1.

30. Receiver according to claim 29, comprising a memory for storing said spectral values ($S_k[m]$) of said signature sequences ($s_k(t)$).

31. Set of at least two encoders for use with a receiver according to claim 29, each encoder (50) of said set of encoders being assigned at least one training sequence ($b_{kt}$) to be sent over a bandwidth-expanding channel during a training phase (30), wherein said at least one training sequence ($b_{kt}$) is chosen such that it is linearly independent from any other training sequence ($b_{kt}$) assigned to any other encoder (50) of said set of encoders.

32. Set of at least two encoders according to claim 31, each said encoder (50) being assigned at least two said training sequences ($b_{kt}$), wherein each said encoder (50) is designed to select from said at least two training sequences ($b_{kt}$) the training sequence ($b_{kt}$) to be sent during said training phase (30).

33. Set of at least two encoders according to claim 31, each said encoder (50) further being assigned a specific coding sequence ($s_k(t)$) for coding a signal ($x(t)$) to be sent over said bandwidth-expanding channel, wherein said coding sequence ($s_k(t)$) is chosen such that, when filtered with a lowpass filter (f), it is orthogonal to any specific coding sequence ($s_k(t)$) assigned to any other encoder (50) of said set of encoders filtered with said lowpass filter (f).

34. An apparatus for processing a signal ($y(t)$) sent over a wireless communication channel, comprising:
  a receiver configured to sample the received signal ($y(t)$) with a sampling frequency ($f_s$) lower than the sampling frequency given by the Shannon theorem, lower than the chip rate ($1/T_c$) of said received signal ($y(t)$), but greater than the rate of innovation ($\rho$) of said received signal ($y(t)$), for generating a set of sampled values ($y(nT_s)$) and to reconstruct the received signal ($y(t)$) using the set of sampled values ($y(nT_s)$).

35. The apparatus of claim 34, further comprising a filter configured to filter the received signal ($y(t)$).

36. The apparatus of claim 35, wherein said filter is a lowpass filter.

37. The apparatus of claim 36, wherein said filter is a sinc filter.

38. The apparatus of claim 36, wherein said filter is a Gaussian filter.

39. The apparatus of claim 38, wherein said wireless communication channel comprises a multipath fading transmission channel.

40. The apparatus of claim 34, wherein said wireless communication channel comprises a CDMA channel.

41. The apparatus of claim 34, wherein said sampling frequency ($1/T_s$) is greater than the information rate ($K/T_b$) of said received signal ($y(t)$).

42. The apparatus of claim 34, wherein said sent signal ($y(t)$) includes a plurality of training sequences ($b_{kt}$) each encoded with a user specific coding sequence ($s_k(t)$) and transmitted by said users, said apparatus further comprising:
  a computing device configured to compute a set of spectral values ($Y[m]$) corresponding to said received signal ($y(t)$) from said set of sampled values ($y(nT_s)$); and
  a processing device configured to recover spectral values ($S_k[m]$) corresponding to each of said user specific coding sequence ($s_k(t)$), and recover the delays ($\tau_k^{(l)}$) and the amplitude attenuations ($a_k^{(l)}$) induced by said communication channel on said sent signal ($y(t)$), from said set of spectral values ($Y[m]$) corresponding to said received signal ($y(t)$) and from said spectral values ($S_k[m]$) corresponding to each of said user specific coding sequence ($s_k(t)$).

43. The apparatus of claim 42, wherein the processing device is further configured to solve a series of one-dimensional estimation problems, the size of each said one-dimensional estimation problem being equal to the number of said sampled values ($y(nT_s)$) generated during one symbol duration ($T_b$).

44. The apparatus of claim 43, wherein said series of one-dimensional equation systems is derived from said spectral values ($Y[m]$) of said received signal ($y(t)$), said spectral values ($S_k[m]$) of each of said user specific coding sequence ($s_k(t)$) and the value of the bits ($b_k^{(h)}$) of said training sequences ($b_{kt}$).

45. The apparatus of claim 44, wherein the receiver is further configured to process a second sent signal ($y(t)$) including a plurality of symbols ($b_k$) each encoded with said user specific coding sequence ($s_k(t)$) and transmitted by said users (k), and sample said second sent signal ($y(t)$) with a sampling frequency lower than the sampling frequency given by the Shannon theorem, but greater than the rate of innovation ($\rho$) of said second sent signal ($y(t)$), for generating a second set of sampled values ($y(nT_s)$).

46. The apparatus of claim 45, wherein the receiver is further configured to run a multiuser detection scheme using said second set of sampled values ($y(nT_s)$) and previously computed said delays ($\tau_k^{(l)}$) and said amplitude attenuations ($a_k^{(l)}$) for estimating the value of the symbol ($b_k$) sent by each said user (k).

47. The apparatus of claim 46, wherein said multiuser detection scheme is a decorrelating detection scheme.

48. The apparatus of claim 46, wherein said multiuser detection scheme is a minimum mean-square error detection scheme.

49. The apparatus of claim 34, wherein said sent signal ($y(t)$) includes a plurality of symbols ($b_k$) each encoded with said user specific coding sequence ($s_k(t)$) and transmitted by said users (k), and
  wherein the receiver is further configured to run a multiuser detection scheme using known delays ($\tau_k^{(l)}$) and amplitude attenuations ($a_k^{(l)}$) induced by said communication channel on said sent signal ($y(t)$) and using said set of sampled values ($y(nT_s)$) and for estimating the value of the symbol ($b_k$) sent by each said user (k).

50. The apparatus of claim 49, wherein said multiuser detection scheme is a decorrelating detection scheme.

51. The apparatus of claim 49, wherein said multiuser detection scheme is a minimum mean-square error detection scheme.

52. The apparatus of claim 34, wherein said sent signal ($y(t)$) includes a plurality of training sequences ($b_{kt}$) each encoded with a user specific coding sequence ($s_k(t)$) and transmitted by said users (k), said apparatus further comprising:
  a computing device configured to compute a set of spectral values ($Y[m]$) of said received signal ($y(t)$) from said set of sampled values ($y(nT_s)$); and
  a processing device configured to compute a set of channel dependant values (C) from said set of spectral values ($Y[m]$) and said training sequences ($b_{kt}$),
  wherein the receiver is further configured to process a second sent signal ($y(t)$) including a plurality of symbols ($b_k$) each encoded with said user specific coding sequence ($s_k(t)$) and transmitted by said users (k), sample said second sent signal ($y(t)$) with a sampling frequency lower than the sampling frequency given by the Shannon theorem, but greater than the rate of innovation ($\rho$) of said second sent signal ($y(t)$), for generating a second set of sampled values ($y(nT_s)$), and retrieve the value of the symbol ($b_k$) sent by each said user (k) by solving a linear matrix system including said second set of sampled values ($y(nT_s)$) and said set of channel dependant values (C).

53. The apparatus of claim 34, wherein said sent signal ($y(t)$) includes a plurality of symbols ($b_k$) each encoded with said user specific coding sequence ($s_k(t)$) and transmitted by said users (k), said user specific coding sequence ($s_k(t)$) being chosen such that, when filtered with a lowpass filter (f), it is orthogonal to any other user's specific coding sequence ($s_k(t)$) used in said communication channel and filtered with said lowpass filter (f), and wherein the receiver is further configured to sample said sent signal (y(t)) with a sampling frequency lower than the sampling frequency given by the Shannon theorem, but greater than the rate of innovation ($\rho$) of said sent signal (y(t)), for generating a set of sampled values ($y(nT_s)$), the apparatus further comprising:

a bank of matched filters configured to filter said set of sampled values ($y(nT_s)$), each filter being matched to said user specific coding sequence ($s_k(t)$) filtered with said lowpass filter (f), for estimating the value of the symbol ($b_k$) sent by each said user (k).

54. The apparatus of claim 34, wherein said communication channel comprises an array of antennas (i).

55. The apparatus of claim 54, wherein said sent signal (y(t)) is the superposition of a plurality of training sequences ($b_{kt}$) each encoded with a user specific coding sequence ($s_k(t)$) and transmitted by said users (k), and wherein the receiver is further configured to sample the received signals ($y_i(t)$) received by each antenna (i) in the antenna array with a sampling frequency ($f_s$) lower than the sampling frequency given by the Shannon theorem, but greater than the rate of innovation ($\rho$) of said received signals ($y_i(t)$), for generating sets of sampled values ($y_i(nT_s)$), the apparatus further comprising:

a computing device configured to compute sets of spectral values ($Y_i[m]$) of said received signals ($y_i(t)$) from said sets of sampled values ($y_i(nT_s)$); and a processing device configured to recover the spectral values ($S_k[m]$) of each of said user specific coding sequence ($s_k(t)$), and retrieve the delays ($\tau_k^{(l)}$), the amplitude attenuations ($a_k^{(l)}$) and the directions of arrival ($\theta_k^{(l)}$) induced by said communication channel on said sent signal (y(t)) from said sets of spectral values ($Y_i[m]$) corresponding to said received signals ($y_i(t)$) and from said spectral values ($S_k[m]$) corresponding to each of said user specific coding sequence ($s_k(t)$).

56. The apparatus of claim 55, wherein the processing device is further configured to solve a series of two-dimensional estimation problems, the size of each said two-dimensional estimation problem being equal to the number of said sampled values ($y_i(nT_s)$) generated during one symbol duration ($T_b$).

57. The apparatus of claim 56, wherein said series of two-dimensional equation systems is derived from said spectral values ($Y_i[m]$) of said received signal ($y_i(t)$), said spectral values ($S_k[m]$) of each of said user specific coding sequence ($s_k(t)$) and the value of the bits ($b_k^{(h)}$) of said training sequences ($b_{kt}$).

58. The apparatus of claim 57, wherein the receiver is further configured to process a second sent signal (y(t)) including a plurality of symbols ($b_k$) each encoded with said user specific coding sequence ($s_k(t)$) and transmitted by said users (k), orient the beams of said array of antennas (i) towards previously determined said arrival directions ($\theta_k^{(l)}$), and sample said second sent signal (y(t)) with a sampling frequency lower than the sampling frequency given by the Shannon theorem, but greater than the rate of innovation ($\rho$) of said second sent signal (y(t)), for generating a second set of sampled values ($y(nT_s)$).

59. The apparatus of claim 58, wherein the receiver is further configured to run a 2D-RAKE detection scheme using said second set of sampled values ($y(nT_s)$) and previously computed said delays ($\tau_k^{(l)}$) and said amplitude attenuations ($a_k^{(l)}$) for estimating the value of the symbol ($b_k$) sent by each said user (k).

60. The apparatus of claim 34, wherein said wireless communication channel comprises an Ultra Wideband (UWB) communication channel.

61. An apparatus for processing a signal, comprising:
means for receiving a signal (y(t)) over a wireless communication channel; and
means for sampling the received signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$)
means for reconstructing the received signal (y(t)) using the set of sampled values ($y(nT_s)$).

62. A mobile station for wireless communication, comprising:
at least one antenna; and
a receiver configured to receive a signal (y(t)) over a wireless communication channel via the at least one antenna, and sample the signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$) and to reconstruct the received signal (y(t)) using the set of sampled values ($y(nT_s)$).

63. Method for processing a signal (y(t)) sent over a wireless communication channel, comprising:
sampling the received signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$)
reconstructing the received signal (y(t)) using the set of sampled values ($y(nT_s)$), wherein the step of reconstructing comprises, retrieving delays ($\tau_k^{(l)}$) and amplitude attenuations ($a_k^{(l)}$) induced by said communication channel on said sent signal (y(t)), from a set of spectral values (Y[m]) corresponding to said received signal (y(t)) and from spectral values ($S_k[m]$) corresponding to a user specific coding sequence ($s_k(t)$).

64. Method for processing a signal (y(t)) sent over a wireless communication channel, comprising:
sampling the received signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$), wherein said sent signal (y(t)) includes a plurality of training sequences ($b_{kt}$) each encoded with a user specific coding sequence ($s_k(t)$) and transmitted by said users (k), said method further comprising,
reconstructing the received signal (y(t)) using the set of sampled values ($y(nT_s)$), wherein the step of reconstructing comprises, computing a set of spectral values (Y[m]) corresponding to said received signal (y(t)) from said set of sampled values ($y(nT_s)$), recovering spectral values ($S_k[m]$) corresponding to each of said user specific coding sequence ($s_k(t)$), retrieving the delays ($\tau_k^{(l)}$) and the amplitude attenuations ($a_k^{(l)}$) induced by said communication channel on said sent signal (y(t)), from said set of spectral values (Y[m]) corresponding to said received signal (y(t)) and from said spectral values ($S_k$[m]) corresponding to each of said user specific coding sequence ($s_k(t)$).

65. Method for processing a signal (y(t)) sent over a wireless communication channel, comprising:

sampling the received signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$), reconstructing the received signal (y(t)) using the set of sampled values ($y(nT_s)$), wherein the step of reconstructing comprises, retrieving delays ($\tau_k^{(l)}$) and amplitude attenuations ($a_k^{(l)}$) induced by said communication channel on said sent signal (y(t)), from a set of spectral values (Y[m]) corresponding to said received signal (y(t)) and from spectral values ($S_k$[m]) corresponding to a user specific coding sequence ($s_k(t)$), wherein retrieving said delays ($\tau_k^{(l)}$) and said amplitude attenuations ($a_k^{(l)}$) includes solving a series of one-dimensional estimation problems, the size of each said one-dimensional estimation problem being equal to the number of said sampled values ($y(nT_s)$) generated during one symbol duration ($T_b$).

66. Method for channel estimation comprising:

sending a signal over an channel to be estimated;

receiving the sent signal (y(t));

determining the rate of innovation ($\rho$) of said received signal (y(t));

sampling the received signal (y(t)) with a sampling frequency ($f_s$) lower than the sampling frequency given by the Shannon theorem, lower than the chip rate ($1/T_c$) of said received signal (y(t)), but greater than the rate of innovation ($\rho$) of said received signal (y(t)), for generating a set of sampled values ($y(nT_s)$)

using the set of sampled values ($y(nT_s)$) to estimate the channel.

* * * * *